(12) United States Patent
Guo et al.

(10) Patent No.: US 9,287,287 B2
(45) Date of Patent: Mar. 15, 2016

(54) SEMICONDUCTOR DEVICE INCLUDING MULTI-LAYER STRUCTURE

(71) Applicant: MACRONIX INTERNATIONAL CO., LTD., Hsinchu (TW)

(72) Inventors: Jung-Yi Guo, Tainan (TW); Chun-Min Cheng, Hsinchu (TW)

(73) Assignee: MACRONIX INTERNATIONAL CO., LTD. (TW)

( * ) Notice: Subject to any disclaimer, the term of this patent is extended or adjusted under 35 U.S.C. 154(b) by 163 days.

(21) Appl. No.: 14/133,486

(22) Filed: Dec. 18, 2013

(65) Prior Publication Data

US 2015/0171105 A1    Jun. 18, 2015

(51) Int. Cl.
*H01L 29/792* (2006.01)
*H01L 27/115* (2006.01)
*H01L 21/02* (2006.01)
*H01L 21/3213* (2006.01)
*H01L 29/51* (2006.01)

(52) U.S. Cl.
CPC ...... *H01L 27/11582* (2013.01); *H01L 21/0217* (2013.01); *H01L 21/02164* (2013.01); *H01L 21/02238* (2013.01); *H01L 21/02255* (2013.01); *H01L 21/32133* (2013.01); *H01L 27/11551* (2013.01); *H01L 27/11578* (2013.01); *H01L 29/513* (2013.01); *H01L 29/518* (2013.01)

(58) Field of Classification Search
CPC ............... H01L 21/02238; H01L 21/02255
USPC ......................................................... 257/324
See application file for complete search history.

(56) References Cited

U.S. PATENT DOCUMENTS

| 4,588,447 | A | * | 5/1986 | Golecki | 438/476 |
|---|---|---|---|---|---|
| 6,140,165 | A | * | 10/2000 | Zhang et al. | 438/166 |
| 6,403,497 | B1 | * | 6/2002 | Oka | H01L 21/2022 257/E21.133 |
| 2003/0160236 | A1 | * | 8/2003 | Yamazaki et al. | 257/53 |
| 2009/0014812 | A1 | * | 1/2009 | Wang et al. | 257/392 |
| 2010/0140684 | A1 | * | 6/2010 | Ozawa | 257/324 |
| 2010/0226195 | A1 | * | 9/2010 | Lue | H01L 27/0688 365/230.06 |

OTHER PUBLICATIONS

Liao et al. "Optical transmission losses in polycrystalline Silicon strip waveguides: Effects of waveguide dimensions, thermal treatment, hydrogen passivation, and wavelength", Journal of Electronic Materials, vol. 29, No. 12, 2000.*

* cited by examiner

*Primary Examiner* — Andy Huynh
*Assistant Examiner* — Sitaramarao S Yechuri
(74) *Attorney, Agent, or Firm* — Baker & McKenzie LLP

(57) ABSTRACT

Present example embodiments relate generally to methods of fabricating a semiconductor device, and semiconductor devices thereof, comprising providing a substrate, forming an insulating base layer on the substrate, and disposing a conductive layer on the insulating base layer at an initial temperature. The methods further comprise increasing the initial temperature at a first increase rate to a first increased temperature and performing an in-situ annealing process to the conductive layer at the first increased temperature. The methods further comprise increasing the first increased temperature at a second increase rate to a second increased temperature, and forming an insulating layer after performing the in-situ annealing process at the second increased temperature.

27 Claims, 9 Drawing Sheets

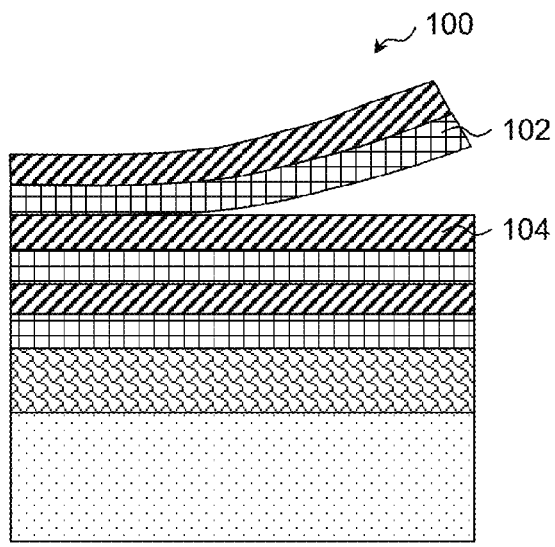 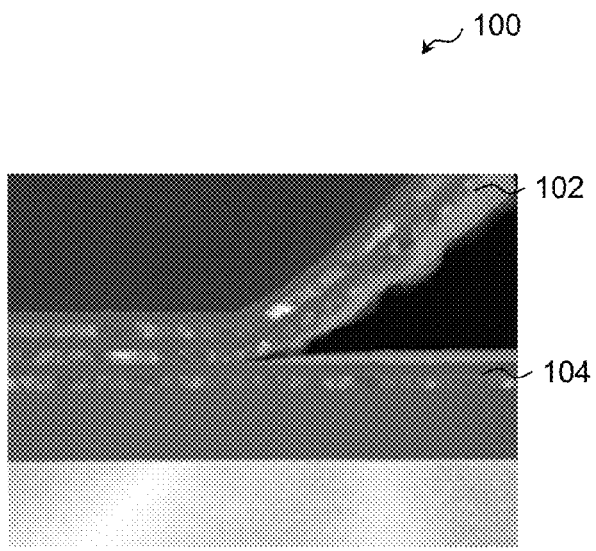
FIG. 1A  FIG. 1B
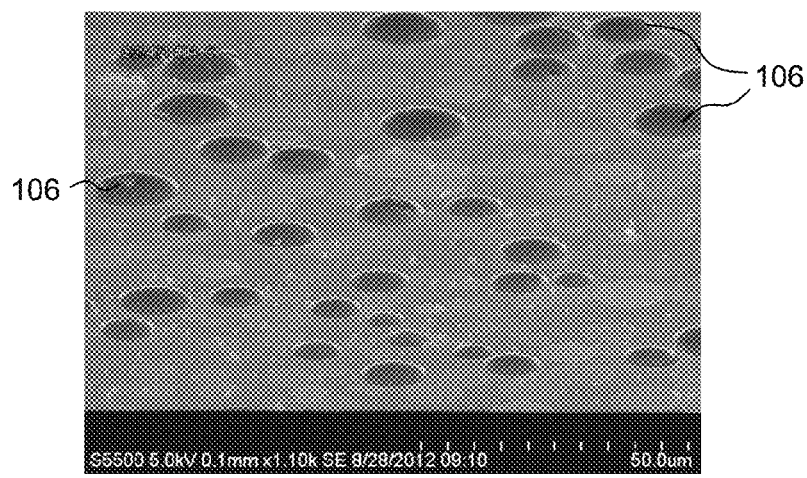
FIG. 1C

SEMICONDUCTOR DEVICE INCLUDING MULTI-LAYER STRUCTURE

BACKGROUND

The present disclosure relates generally to multilayer semiconductor structures, and more specifically, relates to forming high quality multilayer stacks for 3D vertical gate (VG) NAND devices.

Semiconductor device manufacturers continue to seek ways to shrink critical dimensions of semiconductor devices and achieve greater storage capacity in smaller areas and at lower costs per bit.

Recent developments include forming three-dimensional (3D) semiconductor devices using thin film transistor (TFT) techniques applied to charge trapping memory techniques, and cross-point array techniques applied for anti-fuse memory. In respect to the latter, multiple layers of word lines and bit lines are provided with memory elements at their respective cross-points. Developments also include forming vertical NAND cells using charge-trapping memory technology, in which a multi-gate field effect transistor structure having a vertical channel operating like a NAND gate uses silicon-oxide-nitride-oxide-silicon (SONOS) charge trapping technology to create a storage site at each gate/vertical channel interface. In respect to the latter, recent developments have improved the size and manufacturing costs for three-dimensional semiconductor devices by forming stacks of strips of conductive material separated by insulating material and providing memory elements in interface regions between conductive materials of the stacks.

BRIEF SUMMARY

Despite recent developments in shrinking critical dimensions of semiconductor devices, such as those described above, it is recognized herein that one or more problems are encountered in the fabrication of three-dimensional semiconductor devices, and in three-dimensional semiconductor devices thereof, including high leakage, high thermal budget, low oxidation reliability, undesirable occurrences of "poly bubbles" on conductive polysilicon layers, small crystal grain sizes of the conducting layers, and peeling of conducting layers.

Present example embodiments relate generally to methods of fabricating a semiconductor device, and semiconductor devices thereof, for addressing one or more problems in semiconductor devices, including those described above.

In an exemplary embodiment, a method of fabricating a semiconductor device is described comprising providing a substrate, forming an insulating base layer on the substrate, and disposing a conductive layer on the insulating base layer at an initial temperature. The method further comprises increasing the initial temperature at a first increase rate to a first increased temperature and performing an in-situ annealing process to the conductive layer at the first increased temperature. The method further comprises increasing the first increased temperature at a second increase rate to a second increased temperature, and forming an insulating layer after performing the in-situ annealing process at the second increased temperature. A semiconductor device fabricated by the aforementioned method is also contemplated in exemplary embodiments.

In another exemplary embodiment, a method of fabricating a semiconductor device is described comprising providing a substrate, forming an insulating base layer on the substrate, and forming a conductive layer on the insulating base layer. The method further comprises subjecting the conductive layer to a first temperature increase to a first increased temperature at a first increase rate, an exposure to the first increased temperature for a first time duration, and an exposure to a second temperature increase to a second increased temperature greater than the first increased temperature at a second increase rate. A semiconductor device fabricated by the aforementioned method is also contemplated in exemplary embodiments.

BRIEF DESCRIPTION OF THE DRAWINGS

For a more complete understanding of the present disclosure, example embodiments, and their advantages, reference is now made to the following description taken in conjunction with the accompanying drawings, in which like reference numbers indicate like features, and:

FIG. 1A is a cross sectional view of a semiconductor device including an occurrence of peeling of a conductive layer;

FIG. 1B is another cross sectional view of a semiconductor device including an occurrence of peeling of a conductive layer;

FIG. 1C is an illustration of an example of an undesirable poly bubble formation on a conductive polysilicon layer of a three-dimensional semiconductor device;

Although similar reference numbers may be used to refer to similar elements for convenience, it can be appreciated that each of the various example embodiments may be considered to be distinct variations.

DETAILED DESCRIPTION

Figure 2:
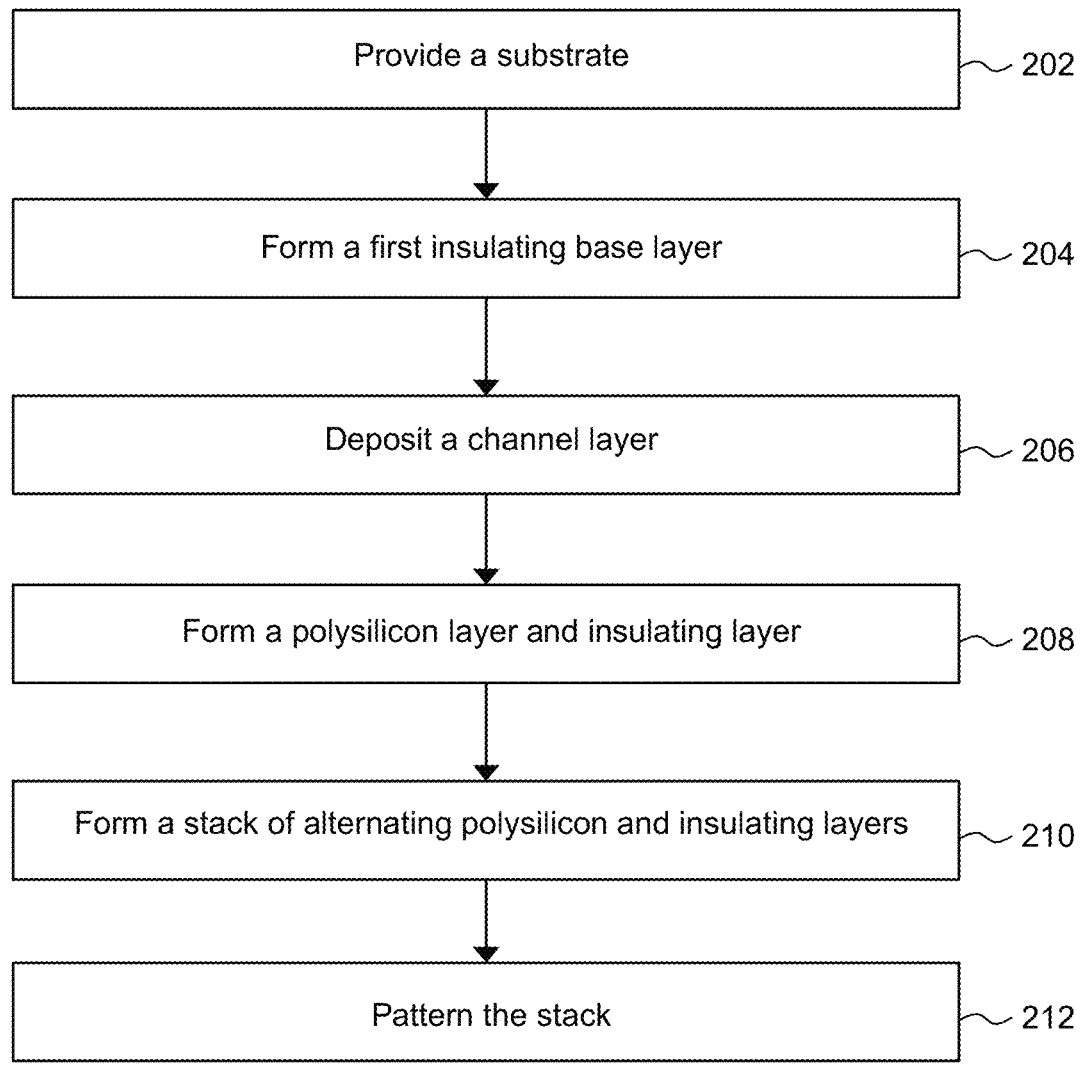
FIG. 2 is a flow diagram of an exemplary method for fabricating a semiconductor device.

Example embodiments will now be described hereinafter with reference to the accompanying drawings, which form a part hereof, and which illustrate example embodiments which may be practiced. As used in the disclosures and the appended claims, the terms "example embodiment," "exemplary embodiment," and "present embodiment" do not necessarily refer to a single embodiment, although they may, and various example embodiments may be readily combined and/or interchanged without departing from the scope or spirit of example embodiments. Furthermore, the terminology as used herein is for the purpose of describing example embodiments only and is not intended to be limitations. In this respect, as used herein, the term "in" may include "in" and "on", and the terms "a", "an" and "the" may include singular and plural references. Furthermore, as used herein, the term "by" may also mean "from", depending on the context. Furthermore, as used herein, the term "if" may also mean "when" or "upon", depending on the context. Furthermore, as used herein, the words "and/or" may refer to and encompass any and all possible combinations of one or more of the associated listed items.

It is recognized herein that three-dimensional semiconductor devices are one way in which semiconductor device manufacturers have achieved greater storage capacity while making dimensions small and achieving lower costs per bit. For example, the size and manufacturing costs for three-dimensional semiconductor devices can be improved by forming stacks of strips of conductive material separated by insulating material and providing memory elements in the interface regions between conductive materials of the stacks. Recent developments in the formation of such stacks include forming an amorphous silicon layer and applying a radical oxidation process so as to crystalize the amorphous silicon layer to form a polysilicon conductive layer and form an insulating oxide layer on the polysilicon conductive layer.

Despite such recent advances in fabricating three-dimensional semiconductor devices, it is recognized herein that such semiconductor device fabrication suffers from one or more problems, including high leakage, high thermal budget, low oxidation reliability, small crystal grain sizes of the conductive polysilicon layers, undesirable formation of "poly bubbles" on conductive polysilicon layers, and catastrophic peeling of conductive polysilicon layers.

FIGS. 1A and 1B provide an illustrative and an actual example of an occurrence of a catastrophic peeling of a conductive polysilicon layer 102 from an insulating layer 104 of a three-dimensional semiconductor device 100. FIG. 1C illustrates an example of undesirable poly bubble formation 106 on a conductive polysilicon layer 102 of a three-dimensional semiconductor device 100.

It is recognized herein that the one or more problems described above are caused by, among other things, applying radical oxidation processes. More specifically, it is recognized herein that significant stresses are imposed on the layers and interfaces thereof during radical oxidation processes when amorphous silicon becomes crystallized and the insulating layer is formed.

Methods of fabricating a semiconductor device, and semiconductor devices thereof, including three-dimensional vertical gate (VG) NAND devices, are described herein for addressing one or more problems discovered in semiconductor devices, including those described above. It is to be understood herein that the principles described herein can be applied outside the context of NAND-type devices described in exemplary embodiments herein.

In an example embodiment, a method of fabricating a semiconductor device is described comprising providing a substrate, forming an insulating base layer on the substrate, and disposing a conductive layer on the insulating base layer at an initial temperature. The method further comprises increasing the initial temperature at a first increase rate to a first increased temperature and performing an in-situ annealing process to the conductive layer at the first increased temperature. The method further comprises increasing the first increased temperature at a second increase rate to a second increased temperature, and forming an insulating layer after performing the in-situ annealing process at the second increased temperature. A semiconductor device fabricated by the aforementioned method is also contemplated in exemplary embodiments.

In another exemplary embodiment, a method of fabricating a semiconductor device is described comprising providing a substrate, forming an insulating base layer on the substrate, and forming a conductive layer on the insulating base layer. The method further comprises subjecting the conductive layer to a first temperature increase to a first increased temperature at a first increase rate, an exposure to the first increased temperature for a first time duration, and an exposure to a second temperature increase to a second increased temperature greater than the first increased temperature at a second increase rate. A semiconductor device fabricated by the aforementioned method is also contemplated in exemplary embodiments.

An example embodiment of a process of fabricating an example embodiment of a semiconductor device, such as a three-dimensional vertical gate (VG) NAND device, is depicted in FIGS. 2-10. As illustrated in the sequence of steps of FIG. 2, the process may include providing a substrate at step 202, forming a first insulating base layer on the substrate at step 204, depositing a channel layer on the insulating base layer at step 206, and forming a polysilicon layer and an insulating layer at step 208. The process may further include forming a stack of alternating polysilicon and insulating layers at step 210, and patterning the stack at step 212. The process may further include forming a three-dimensional vertical gate (VG) NAND device. Semiconductor devices other than NAND-type devices are also contemplated in example embodiments. These processes will now be described with references to FIGS. 2-10.

(1) Providing a Substrate (e.g., Step 202).

Substrates 302 suitable for use in semiconductor devices may be obtained by any one of many manufacturing methods, such as pressing methods, float methods, down-drawn methods, redrawing methods, fusion methods, or the like.

(2) Forming a First Insulating Base Layer (e.g., Step 204).

Figure 3:
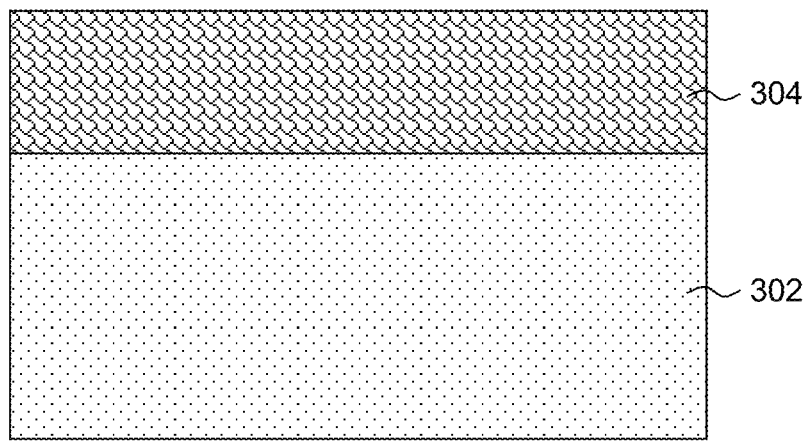
FIG. 3 is a cross-sectional illustration of an example embodiment having an insulating base layer deposited on a substrate.

A substrate 302 obtained from the above step 202 was provided with an insulating base layer 304 thereon, as illustrated in FIG. 3. The insulating base layer 304 may isolate the substrate 302 from the next layer 306 (as described in No. 3 below) and act as an etch stop in a subsequent patterning process at step 212 (as described in No. 6 below). The insulating base layer 304 formed may be about 2000 Angstroms in thickness. It is recognized herein that the insulating base layer 304 may be any desired thickness, including about 1000-4000 Angstroms in thickness.

(3) Depositing a Channel Layer (e.g., Step 206).

Figure 4:
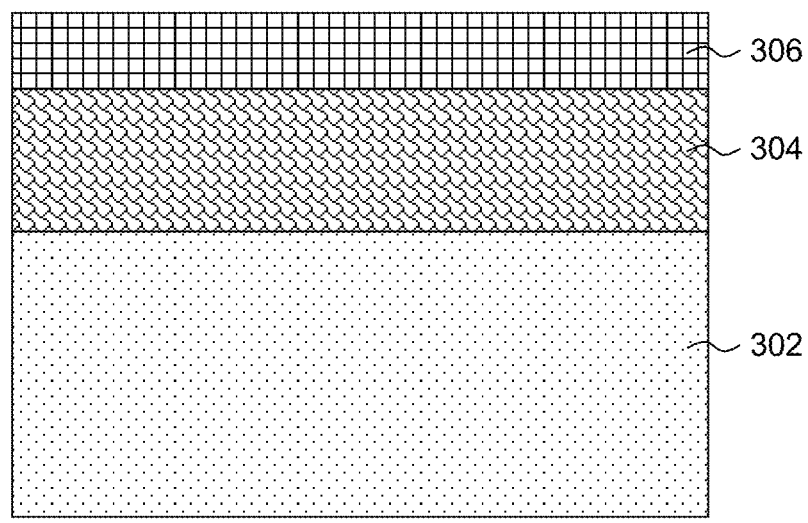
FIG. 4 is a cross-sectional illustration of an example embodiment having a channel layer deposited on the insulating base layer.

Referring to FIG. 4, a channel layer 306 may be formed on the insulating base layer 304. The channel layer 306 may be a substantially amorphous p-type silicon layer 306. It is recognized herein that the channel layer 306 may comprise un-doped, n-type, or p-type amorphous silicon in example embodiments.

(4) Forming a Polysilicon Layer and an Insulating Layer (e.g., Step 208).

Figure 5A:
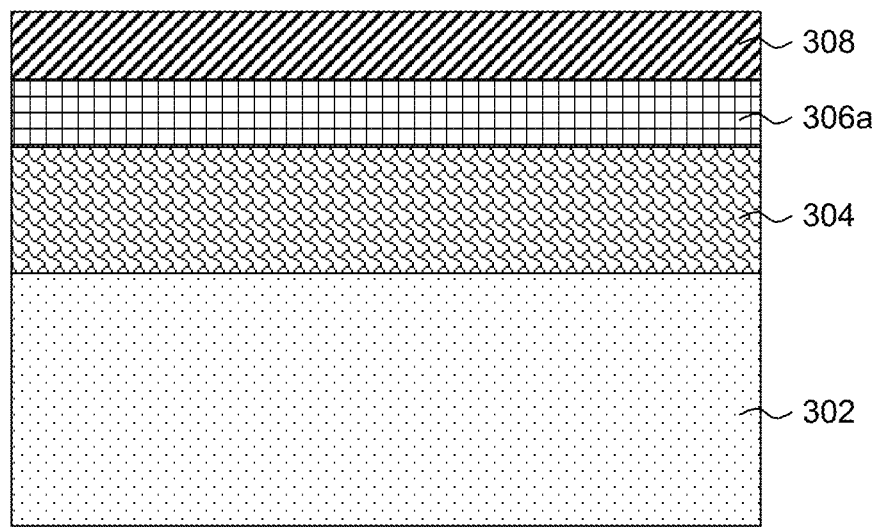
FIG. 5A is a cross-sectional illustration of an example embodiment having a conductive polysilicon layer formed from the channel layer and an insulating layer formed using in-situ annealing and oxidation.
Figure 5B:
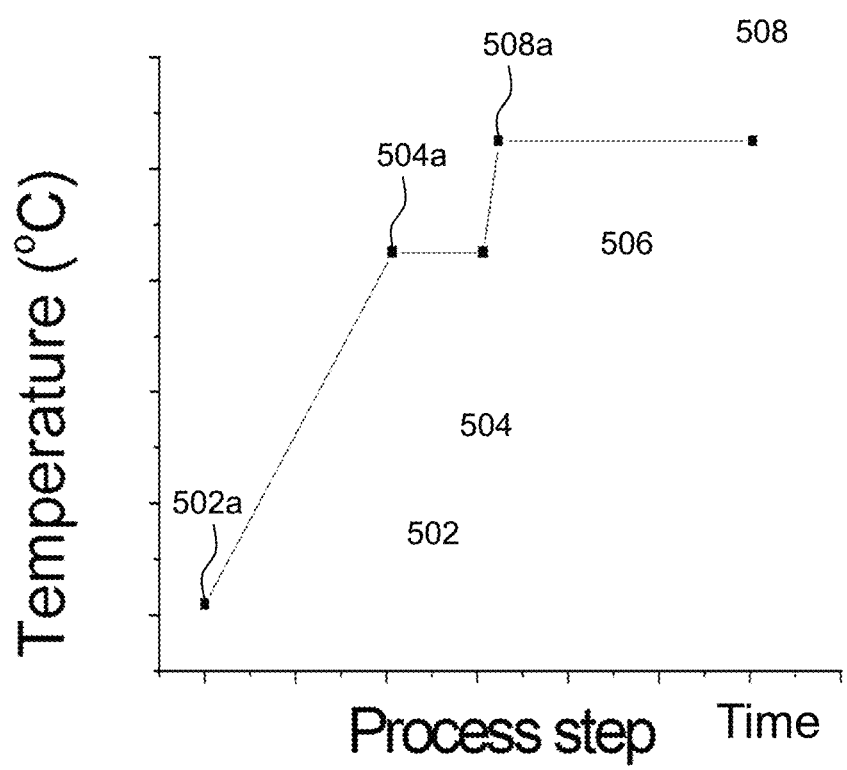
FIG. 5B is a plot of temperature in an exemplary process for forming a conductive polysilicon layer.

As illustrated in the cross-sectional view of FIG. 5A and the process 208 of FIG. 5B, the substantially amorphous silicon layer 306 deposited in the above process 206 was subjected to a first temperature increase stage 502 from an initial temperature 502a of about 200 degrees Celsius to a first increased temperature 504a of about 600 degrees Celsius at a relatively slow temperature increase rate of about 20 degrees Celsius per second. The first temperature increase stage 502 may be performed in a nitrogen ambient environment and under a pressure of about 7.5 Torr. The temperature increase rate may be less than or equal to about 50 degrees Celsius per second, which may assist in encouraging the formation of larger crystal grains in the subsequent annealing process (as described below). It will be appreciated that the first temperature increase stage 502 may or may not be performed in a nitrogen ambient environment, and may be subject to a lower or greater pressure in example embodiments.

An in-situ nitrogen annealing process 504 was then applied at a constant temperature 504a of about 600 degrees Celsius and under a low pressure of about 7.5 Torr for about 30 seconds. The annealing process 504 was operable to crystallize the abovementioned deposited substantially amorphous silicon layer 306 so as to form a substantially crystalline conductive polysilicon layer 306a having substantially large crystal grains. The thickness of the conductive polysilicon layer 306a was about 200 Angstroms. It is recognized herein that the annealing process 504 may be performable in a temperature 504a of about 600 degrees Celsius to about 1100 degrees Celsius and under a pressure of about 0.1-20 Torr in example embodiments. It is also recognized herein that the annealing process 504 may be performable for a duration of about 1-60 seconds in example embodiments, and the thickness of the conductive polysilicon layer 306a may be about 100-300 Angstroms in example embodiments.

Thereafter, a second temperature increase stage 506 was performed from the first increased temperature 504a of about 600 degrees Celsius to a second increased temperature 508a of about 1050 degrees Celsius at a second temperature increase rate of about 80 degrees Celsius and in a nitrogen, (N2+O2), or (H2+O2) ambient environment. It is recognized herein that the second increased temperature 508a may be between about 650-1200 degrees Celsius, and the above process 506 may or may not be performed in a nitrogen ambient environment in example embodiments. It is also recognized herein that the second temperature increase rate may be more than, equal to, or less than the first temperature increase rate in example embodiments, such as about 50-100 degrees Celsius. To gain process efficiency, however, the second temperature increase rate may be greater than the first temperature increase rate.

Upon reaching the second increased temperature 508a of about 1050 degrees Celsius, an oxidation process 508 was applied, including introducing hydrogen (H2) and oxygen (O2) gas mixtures to generate O and OH radicals and form an insulating (oxide) layer 308 on the polysilicon conductive layer 306a (formed by the in-situ annealing process 504). The gas mixture introduced included about 33% hydrogen (H2), but other gas mixtures are contemplated in example embodiments. The oxidation process 508 was performed in a (H2+O2) environment, at a pressure of about 7.5 Torr, and for a duration of about 30 seconds. The thickness of the resulting insulating layer 308 was about 200 Angstroms. It is recognized herein that the second increased temperature 508a may be between about 650-1200 degrees Celsius, and the oxidation process 508 may or may not be performed in a nitrogen environment and may be under a pressure of about 0.1-20 Torr in example embodiments. It is also recognized herein that the oxidation process 508 may be performable for a duration of about 1-60 seconds, and the thickness of the insulating layer 308 may be about 100-300 Angstroms in example embodiments.

(5) Forming a Stack of Alternating Polysilicon and Insulating Layers (e.g., Step 210).

Figure 6:
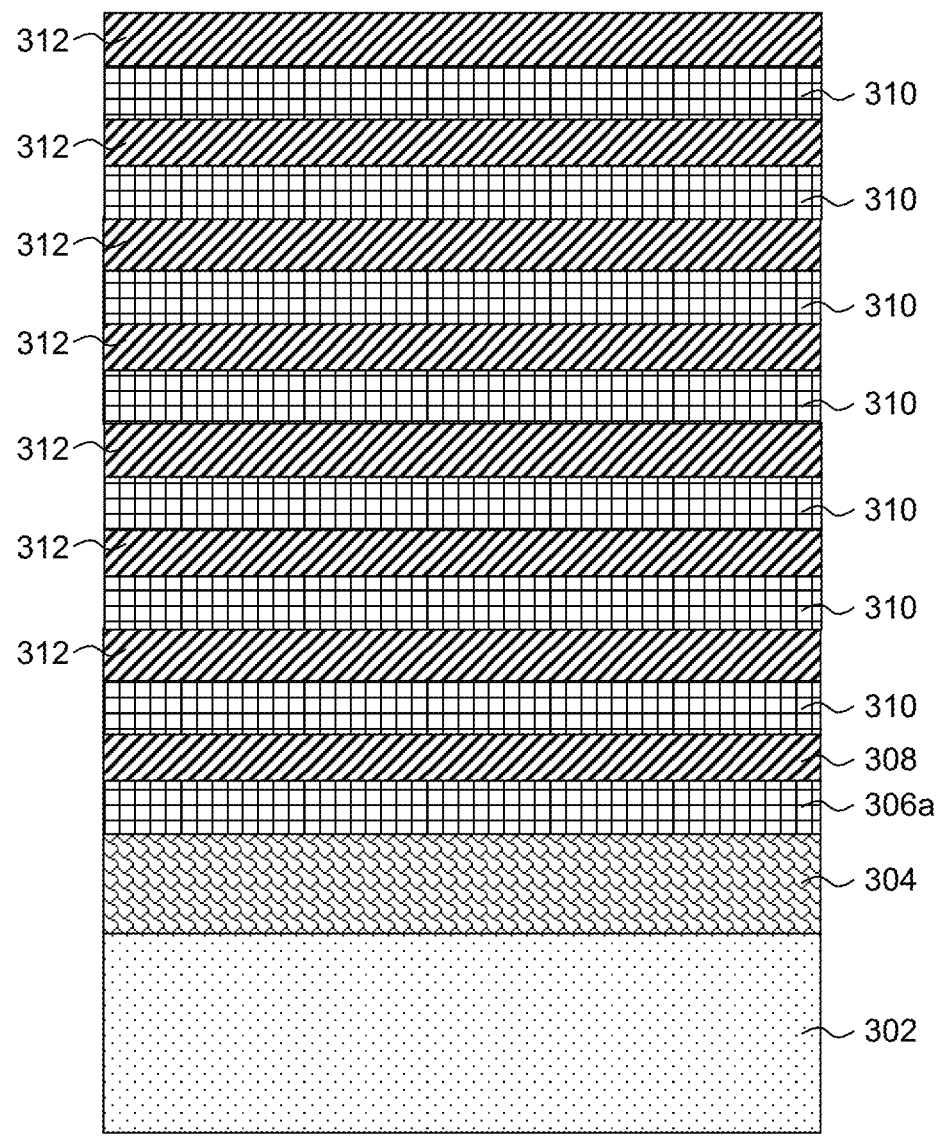
FIG. 6 is a cross-sectional illustration of an example embodiment of forming a stack of alternating polysilicon and insulating layers.

As illustrated in FIG. 6, a stack of alternating conductive polysilicon 310 and insulating 312 layers may be formed after the above process 508. One or more of the conductive polysilicon layers 310 may be formed using substantially the same process 206 and 208 as described in Nos. 3 and 4 above, including depositing a substantially amorphous silicon layer 206 on the underlying insulating layer, performing a first temperature increase 502 to a first increased temperature 504a of about 600-1100 degrees Celsius at a temperature increase rate of less than or equal to about 50 degrees Celsius per second, performing an in-situ nitrogen annealing process 504 at the first increased temperature 504a for a duration of about 1-60 seconds, performing a second temperature increase 506 to a second increased temperature 508a at a second temperature increase rate of greater than or equal to the first temperature increase rate, performing an oxidation process 508 at the second increased temperature 508a for a second duration of about 1-60 seconds, and repeating for the rest of the stack.

In example embodiments, a total of 8 alternating polysilicon 310 and insulating 312 layers were formed in the stack. It is to be understood herein that the number of alternating polysilicon 310 and insulating 312 layers formed in the stack may be greater than or less than 12 in example embodiments. Furthermore, it is recognized herein that the nitrogen environment (or lack thereof), the applied pressure, the temperatures, the temperature increase rates, the duration, the thicknesses of each layer, and other process variables may be substantially the same as or modified from those described above and herein.

Figure 10:
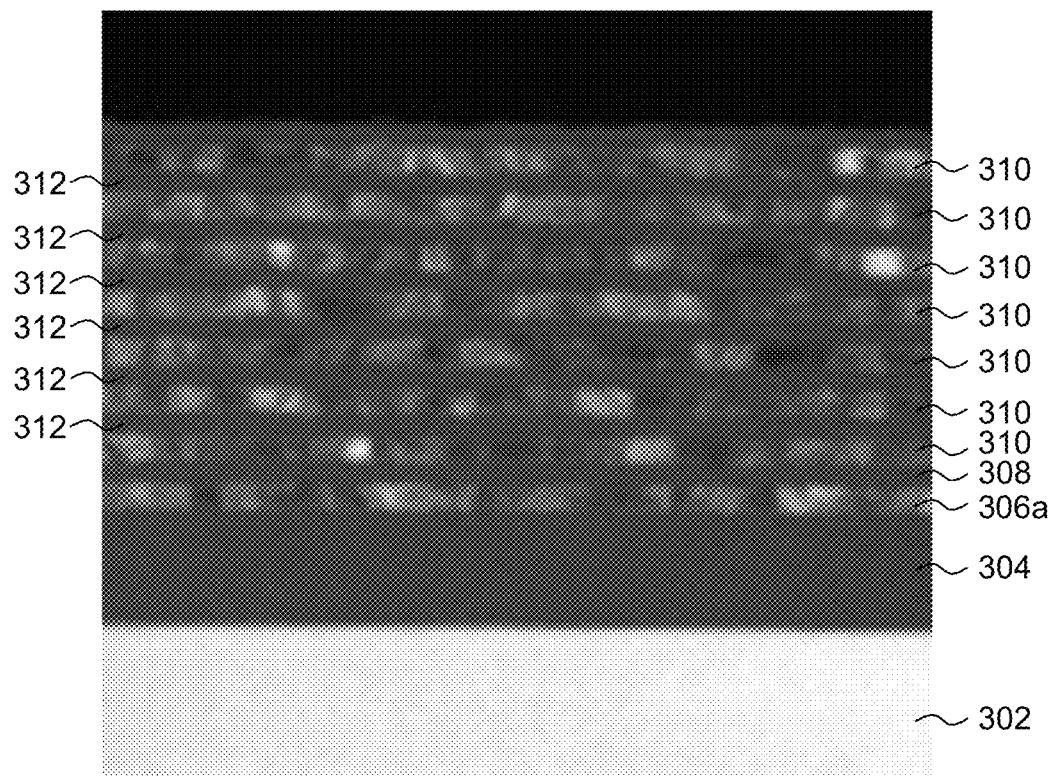
FIG. 10 is an example cross-sectional illustration of an example embodiment of a semiconductor device comprising a stack of alternating polysilicon and insulating layers formed using example method embodiments.

As illustrated in FIG. 10, the stack of alternating conductive polysilicon 306a and 310 and insulating 308 and 312 layers formed by the above processes exhibited excellent properties, including low leakage, low thermal budget requirement, high oxidation reliability, and comprised substantially large crystal grain sizes in the conductive polysilicon layers 306a and 310. Furthermore, the stack of alternating conductive polysilicon 306a and 310 and insulating 308 and 312 layers did not exhibit any indications of undesirable "poly bubbles" on conductive polysilicon layers and/or peeling of conductive polysilicon layers 306a and/or 310 from insulating layers 308 and/or 312.

(6) Patterning the Stacks (e.g., Step 212).

Figure 7:
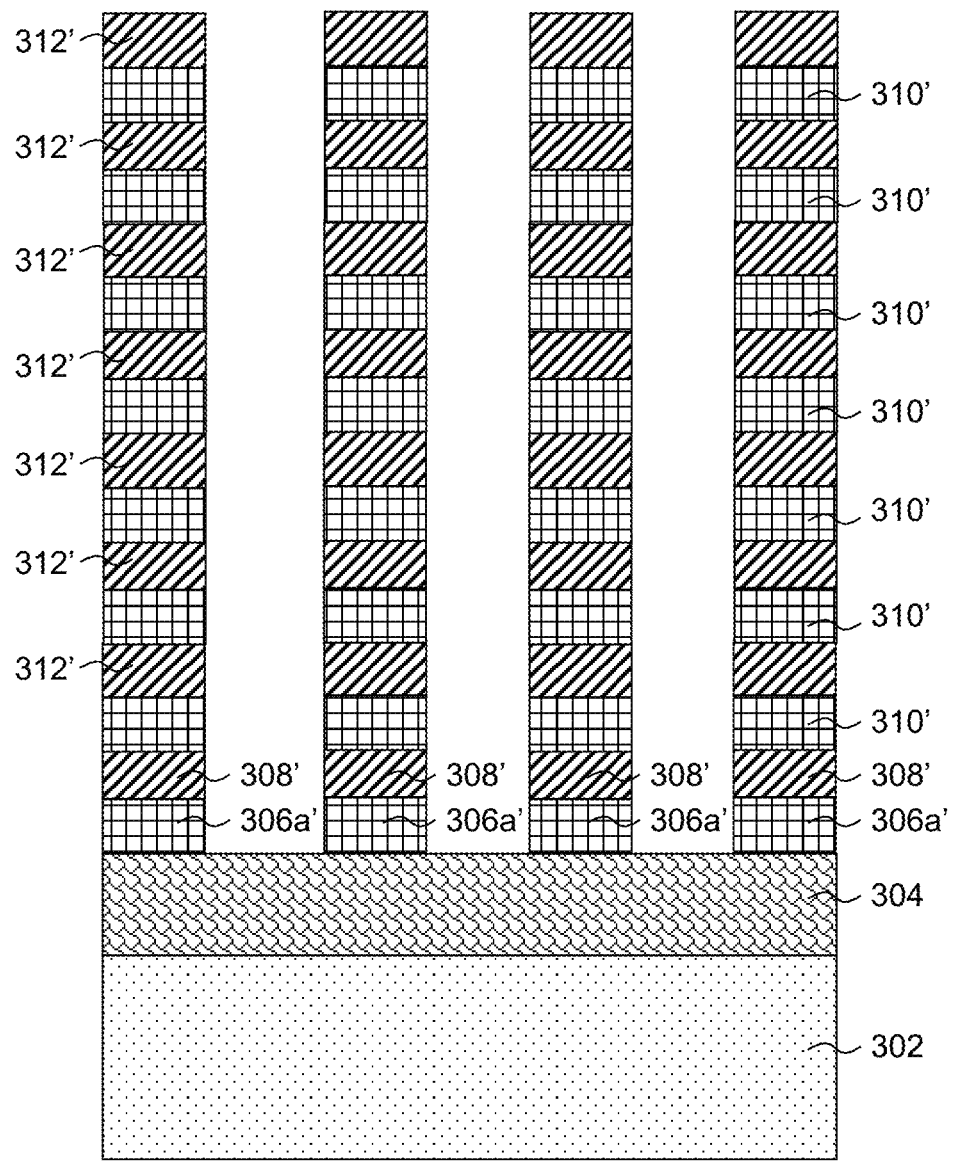
FIG. 7 is a cross-sectional illustration of an example embodiment of patterning the stack of alternating polysilicon and insulating layers.

The stack of alternating polysilicon 306a, 310 and insulating 308, 312 layers obtained in the above No. 5 process 210 was then subjected to a patterning process 212, resulting in a series of patterned stacks of alternating polysilicon 306a', 310' and insulating 308', 312' layers, as illustrated in FIG. 7. In performing the patterning process 212, a photolithography process was used by applying a photoresist mask (not shown) having pre-formed patterns thereon and etching the alternating polysilicon 306a, 310 and insulating 308, 312 layers according to the pre-formed patterns on the photoresist mask. As previously explained, the insulating base layer 304 was operable to provide an etch stop and therefore the insulating base layer 304 was not etched. A series of patterned stacks of polysilicon 306a', 310' and insulating 308', 312' layers was obtained, as illustrated in FIG. 7.

(7) Forming a Three-Dimensional Vertical Gate (VG) NAND Device.

The series of patterned stacks of alternating conductive polysilicon 306a', 310' and insulating 308', 312' layers was further provided with a process to form a three-dimensional vertical gate (VG) NAND device. In an example embodiment illustrated in FIG. 8, a layer of memory material 802 including a bandgap engineered silicon-oxide-nitride-oxide-silicon (BE-SONOS) charge storage structure was formed over each patterned stack in the series of patterned stacks of alternating polysilicon 306a', 310' and insulating 308', 312' layers, that is, on a top surface and on two opposing sides of each patterned stack. The layer of memory material 802 was also formed on the insulating base layer between the patterned stacks. The layer of memory material 802 including the BE-SONOS charge storage structure further included an inner-most dielectric tunneling layer 802a that includes a composite of materials forming an inverted "U" shaped valence band under zero bias voltage, a subsequent charge storage layer 802b comprising silicon oxide, and a gate 802c comprising polysilicon. The dielectric tunneling layer further included a hole tunneling layer (not shown), a band offset layer (not shown), and an isolation layer (not shown).

Figure 8:
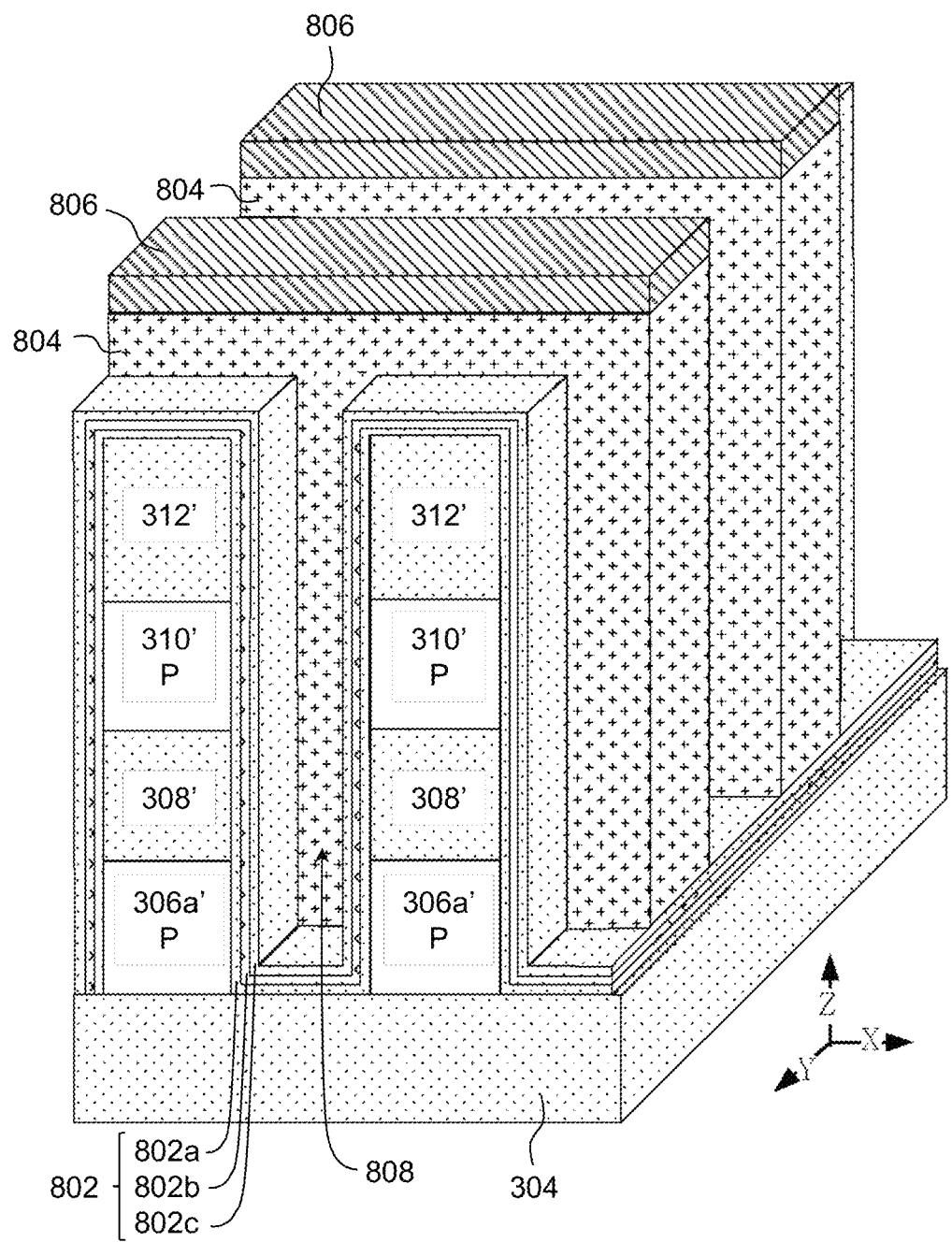
FIG. 8 is a perspective illustration of an example embodiment of forming a three dimensional semiconductor device.

Conductive lines 804 were further provided, the conductive lines 804 having surfaces conformal to the series of patterned stacks, filling trenches 808 defined by the series of patterned stacks, and defining a multi-layer array of interface regions at cross-points between side surfaces of conductive polysilicon layers 306a' and 310'. Furthermore, a layer of silicide 806 (such as tungsten silicide, cobalt silicide, and/or titanium silicide) was formed atop each conductive line 804. Other layer(s) and/or filler(s) not shown in FIG. 8 are also contemplated in example embodiments.

Figure 9:
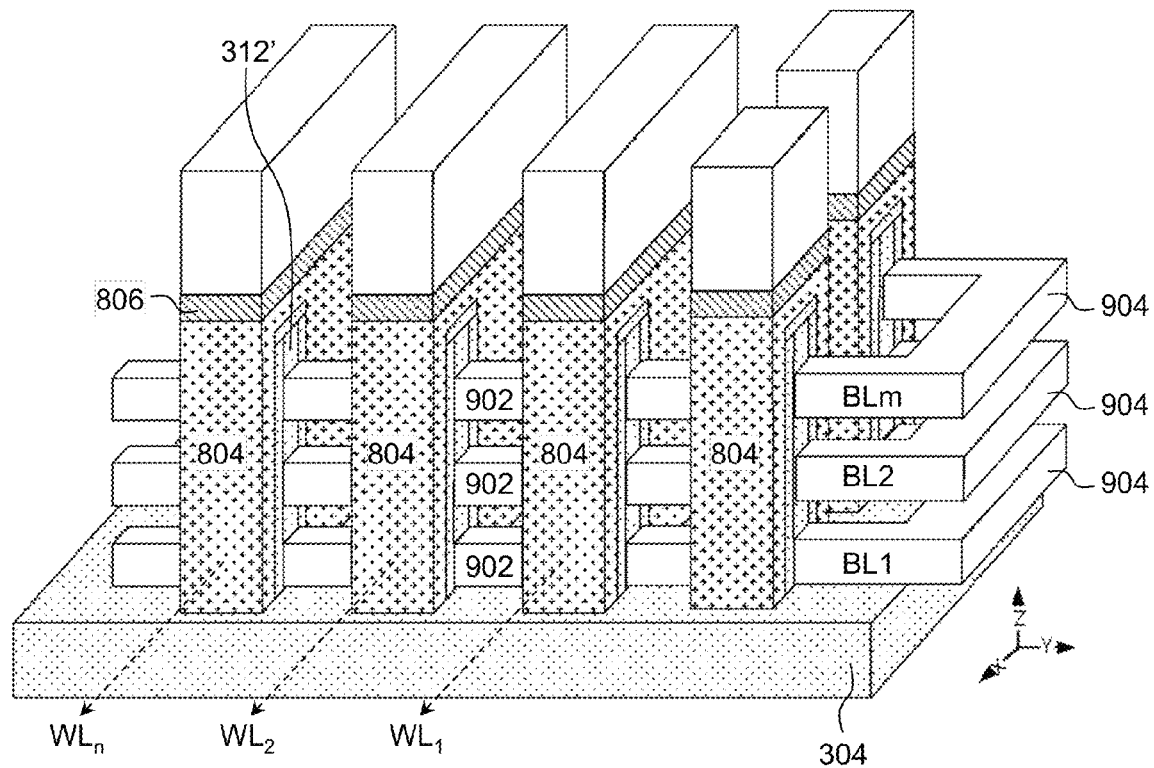
FIG. 9 is a perspective illustration of an example embodiment of forming a three dimensional semiconductor device.

As illustrated in FIG. 9, a plurality of conductive strips 902 were then coupled to conductive polysilicon layers 306a' and 310' in the same plane by extensions 904. As a result, a multi-layer array was formed on insulating base layer 304 to provide word lines WLn, WL2, . . . , WL1 and bit lines BLm, . . . , BL2, BL1, wherein n is an integer greater than or equal to 1. It is to be understood herein that the aforementioned fabrication steps to form a three-dimensional vertical gate (VG) NAND device may be achieved from the series of patterned stacks obtained in No. 6 above in other ways, and semiconductor devices other than three dimensional vertical gate (VG) NAND devices are also contemplated in example embodiments.

While various embodiments in accordance with the disclosed principles have been described above, it should be understood that they have been presented by way of example only, and are not limiting. Thus, the breadth and scope of the example embodiments described herein should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Various terms used herein have special meanings within the present technical field. Whether a particular term should be construed as such a "term of art" depends on the context in which that term is used. "Connected to," "in communication with," "associated with," or other similar terms should generally be construed broadly to include situations both where communications and connections are direct between referenced elements or through one or more intermediaries between the referenced elements. These and other terms are to be construed in light of the context in which they are used in the present disclosure and as one of ordinary skill in the art would understand those terms in the disclosed context. The above definitions are not exclusive of other meanings that might be imparted to those terms based on the disclosed context.

Words of comparison, measurement, and timing such as "at the time," "equivalent," "during," "complete," and the like should be understood to mean "substantially at the time," "substantially equivalent," "substantially during," "substantially complete," etc., where "substantially" means that such comparisons, measurements, and timings are practicable to accomplish the implicitly or expressly stated desired result.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, a description of a technology in the "Background" is not to be construed as an admission that technology is prior art to any invention(s) in this disclosure. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings herein.

What is claimed is:

1. A method of fabricating a semiconductor device, the method comprising:

providing a substrate;

forming an insulating base layer on the substrate;

disposing a conductive layer on the insulating base layer at an initial temperature;

subjecting the conductive layer to an increase in temperature at a first increase rate from the initial temperature to a first increased temperature, wherein the subjecting of the conductive layer to the increase in temperature from the initial temperature to the first increased temperature is performed in a nitrogen environment;

performing an in-situ annealing process to the conductive layer at the first increased temperature;

subjecting the conductive layer to a second increase in temperature at a second increase rate from the first increased temperature to a second increased temperature, the second increase rate being greater than the first increase rate;

forming an insulating layer on the conductive layer after performing an in-situ annealing process at the second increased temperature;

disposing a second conductive layer on the insulating layer at the initial temperature;

subjecting the second conductive layer to an increase in temperature at the first increase rate from the initial temperature to the first increased temperature, wherein the subjecting of the conductive layer to the increase in temperature from the initial temperature to the first increased temperature is performed in a nitrogen environment;

performing an in-situ annealing process to the second conductive layer at the first increased temperature;

subjecting the second conductive layer to a second increase in temperature at the second increase rate from the first increased temperature to the second increased temperature; and forming a second insulating layer on the second conductive layer after performing an in-situ annealing process to the second conductive layer at the second increased temperature.

2. The method of claim 1, wherein:
the first increased temperature is about 600 degrees Celsius or more,
the second increased temperature is greater than the first increased temperature, and
the first increase rate is about 50 degrees Celsius per second or less.

3. The method of claim 1, wherein the first increased temperature is a temperature of about 600-1100 degrees Celsius and the second increased temperature is a temperature of about 700-1200 degrees Celsius.

4. The method of claim 1, wherein the first increase rate is about 1-30 degrees Celsius per second.

5. The method of claim 1, wherein the increasing from the first increased temperature to the second increased temperature is performed in a nitrogen, (N2+O2), or (H2+O2) environment, and wherein the in-situ annealing processes are a nitrogen annealing process.

6. The method of claim 1, wherein the insulating layer is formed by an oxidation process comprising introducing a mixture of hydrogen and oxygen gas.

7. The method of claim 6, wherein the oxidation process is performed for a duration of about 1 to 60 seconds, and wherein the in-situ annealing processes are performed for a duration of about 1 to 60 seconds.

8. The method of claim 6, wherein the oxidation process is a low pressure process of about 0.1-20 Torr, and wherein the in-situ annealing processes are a low pressure process of about 0.1-20 Torr.

9. The method of claim 1, further comprising forming a stack of alternating conductive and insulating layers on the second insulating layer.

10. The method of claim 9, wherein one or more of the conductive layers in the stack is formed by disposing a conductive layer on an immediately preceding insulating layer and performing an in-situ annealing process on the disposed conductive layer, and each insulating layer is formed on each immediately preceding conductive layer after the in-situ annealing process.

11. The method of claim 9, further comprising patterning one or more of the conductive layers.

12. The method of claim 11, further comprising forming memory elements in the patterns of the one or more conductive layers to establish a 3 dimensional array of memory cells.

13. The semiconductor device fabricated by the method of claim 1.

14. A method of fabricating a semiconductor device, the method comprising:
providing a substrate;
forming an insulating base layer on the substrate;
forming a conductive layer on the insulating base layer and subjecting the conductive layer to:
a first temperature increase to a first increased temperature at a first increase rate, wherein the subjecting the conductive layer to the first temperature increase to the first increased temperature is performed in a nitrogen environment;
an exposure to the first increased temperature for a first time duration; and
an exposure to a second temperature increase to a second increased temperature greater than the first increased temperature at a second increase rate, the second increase rate being greater than the first increase rate:
forming an insulating layer on the conductive layer after subjecting the conductive layer to the second temperature increase to the second increased temperature;
forming a second conductive layer on the insulating layer and subjecting the second conductive layer to:
a first temperature increase to the first increased temperature at the first increase rate, wherein the subjecting the second conductive layer to the first temperature increase to the first increased temperature is performed in a nitrogen environment,
an exposure to the first increased temperature for the first time duration; and
an exposure to a second temperature increase to the second increased temperature at the second increase rate; and
forming a second insulating layer on the second conductive layer after subjecting the second conductive layer to the second temperature increase to the second increased temperature.

15. The method of claim 14, wherein forming the insulating layer on the conductive layer includes performing an oxidation process at the second increased temperature.

16. The method of claim 15, further comprising forming a stack of alternating conductive and insulating layers on the second insulating layer.

17. The method of claim 16, wherein one or more of the conductive layers in the stack is formed by disposing a conductive layer on an immediately preceding insulating layer and performing an in-situ annealing process on the disposed conductive layer, and each insulating layer is formed on each immediately preceding conductive layer after the in-situ annealing process.

18. The method of claim 16, further comprising patterning one or more of the conductive layers.

19. The method of claim 16, further comprising forming memory elements in the patterns of the one or more conductive layers to establish a 3 dimensional array of memory cells.

20. The method of claim 14, wherein a nitrogen annealing process is applied during the first time duration.

21. The method of claim 20, wherein a pressure of about 0.1-20 Torr is applied during the nitrogen annealing process.

22. The method of claim 14, wherein the first increased temperature is about 600 degrees Celsius or more, and wherein the first increase rate is about 50 degrees Celsius per second or less.

23. The method of claim 14, wherein the first increased temperature is about 600-1100 degrees Celsius and the second increased temperature is about 650-1200 degrees Celsius.

24. The method of claim 14, wherein the first increase rate is about 1-30 degrees Celsius per second or less.

25. The method of claim 14, wherein the first time duration is about 1 to 60 seconds.

26. The method of claim 14, wherein at least a portion of the forming the conductive layer is performed in a nitrogen environment.

27. The semiconductor device fabricated by the method of claim 14.

* * * * *